United States Patent
Fletcher et al.

(10) Patent No.: US 6,667,645 B1
(45) Date of Patent: Dec. 23, 2003

(54) PULSED CLOCK SIGNAL TRANSFER CIRCUITS WITH DYNAMIC LATCHING

(75) Inventors: Thomas D. Fletcher, Portland, OR (US); Eitan Rosen, Abirim (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/467,214

(22) Filed: Dec. 20, 1999

(51) Int. Cl.⁷ ................................................ H03K 3/356
(52) U.S. Cl. ........................................ 327/200; 327/201
(58) Field of Search .................................. 327/199, 200, 327/201, 202, 203, 208–212, 218, 224, 141, 144

(56) References Cited

U.S. PATENT DOCUMENTS

| | | | |
|---|---|---|---|
| 5,258,919 A | * 11/1993 | Yamanouchi et al. ........ | 364/489 |
| 5,300,831 A | * 4/1994 | Pham et al. .................... | 326/44 |
| 5,457,698 A | * 10/1995 | Segawa et al. ............... | 714/731 |
| 5,553,276 A | * 9/1996 | Dean ............................ | 713/500 |
| 5,619,157 A | * 4/1997 | Kumata et al. .............. | 327/203 |

* cited by examiner

*Primary Examiner*—Tuan T. Lam
(74) *Attorney, Agent, or Firm*—Schwegman, Lundberg, Woessner & Kluth, P.A.

(57) ABSTRACT

A signal transfer clocking circuit is disclosed which features a first stage including a first latch and a first, non-clocking circuit in series therewith and a second stage including a second, dynamic latch and at least a second circuit in series therewith. The first latch has a data input side and is opened in response to a first level of a pulse clock signal applied thereto to effect transfer of incoming data through the first stage in a first phase of operation of the signal transfer clocking circuit. The dynamic latch has a data input coupled to an output of the first circuit and is opened in response to a second level of the same or different pulse clock signal applied thereto as that applied to the first latch to effect transfer of data generated by the first stage, through the second stage, to at least one succeeding circuit, in a second, successive phase of operation of the signal transfer clocking circuit, the succeeding circuit being opened and closed by a clock signal having phase and frequency characteristics linked to that applied to the dynamic latch. The dynamic latch clocking methodology used in the signal transfer clocking circuit is particularly applicable to any traditional static latch circuits, such as CMOS static latch circuitry, although not limited thereto, to minimize min-delay race violations and to effect a skew-tolerant operation.

31 Claims, 13 Drawing Sheets

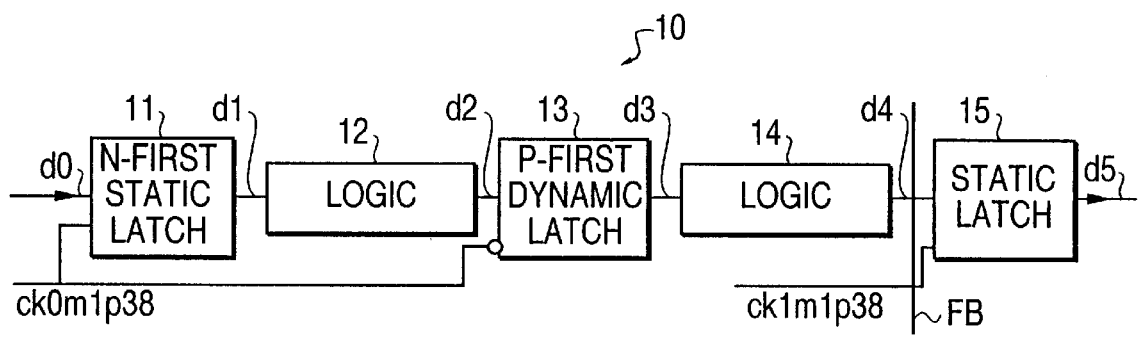
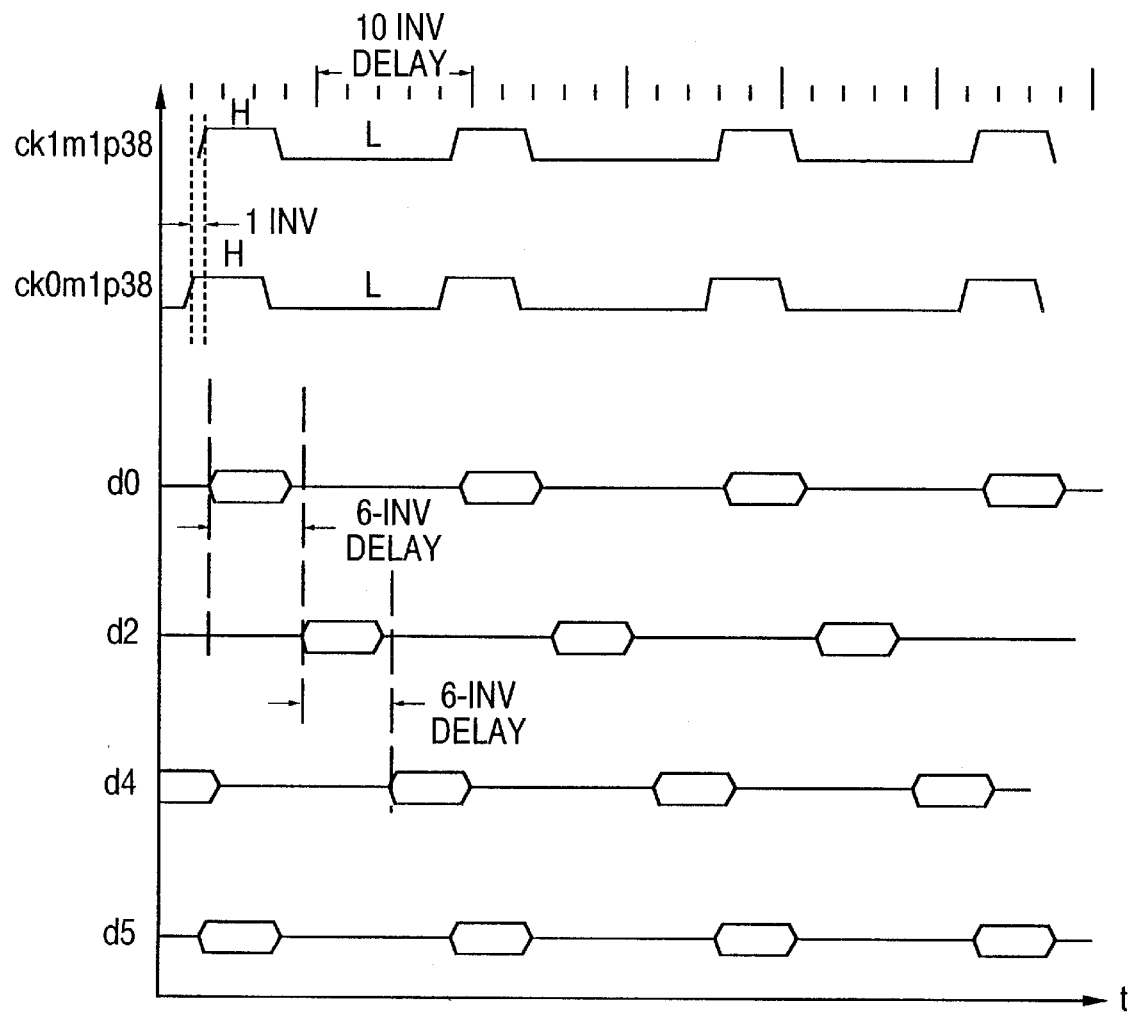

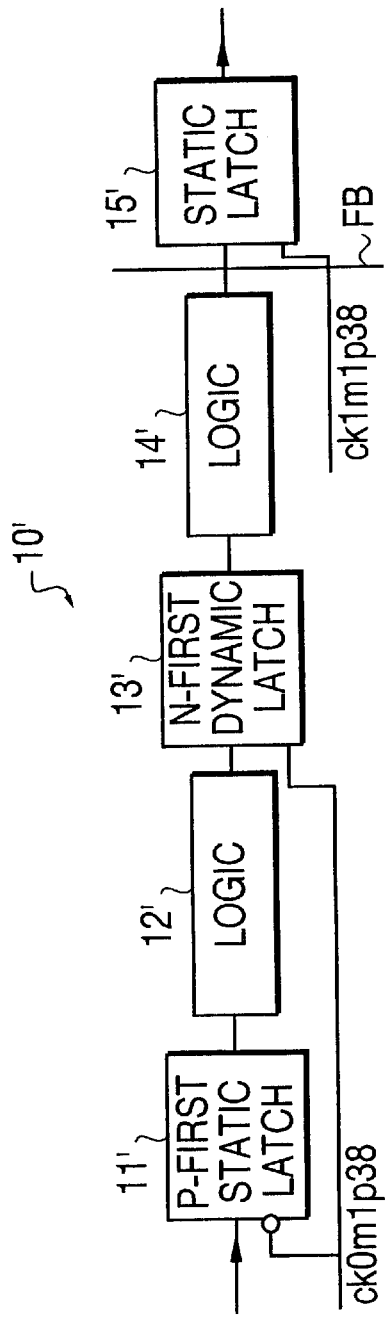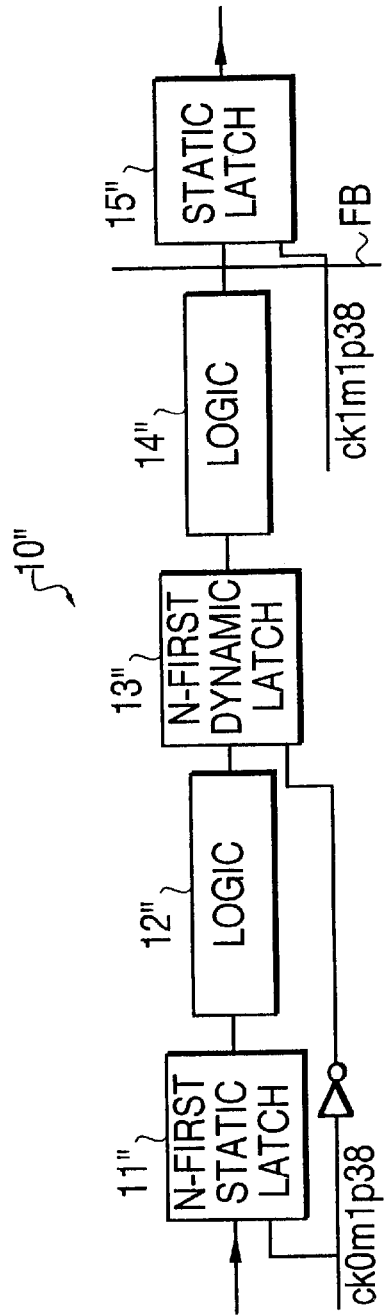

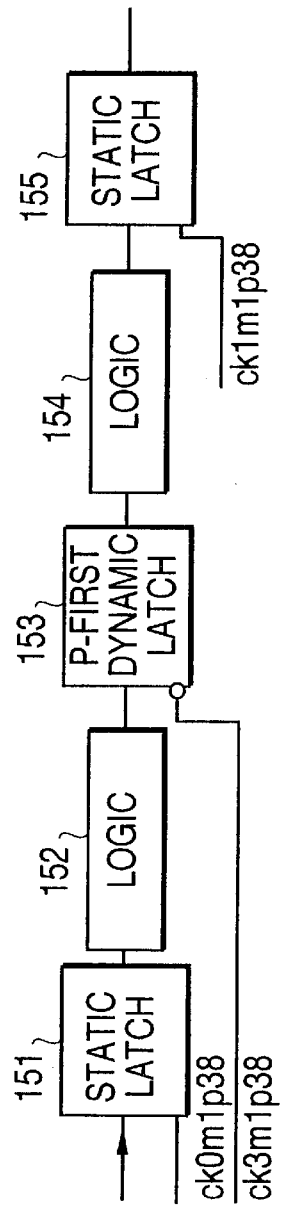
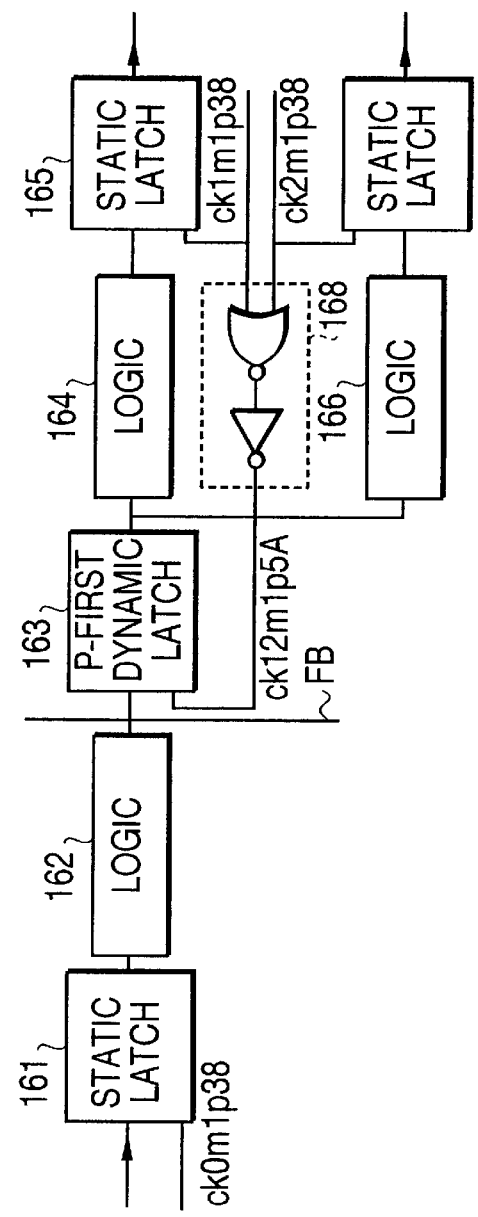

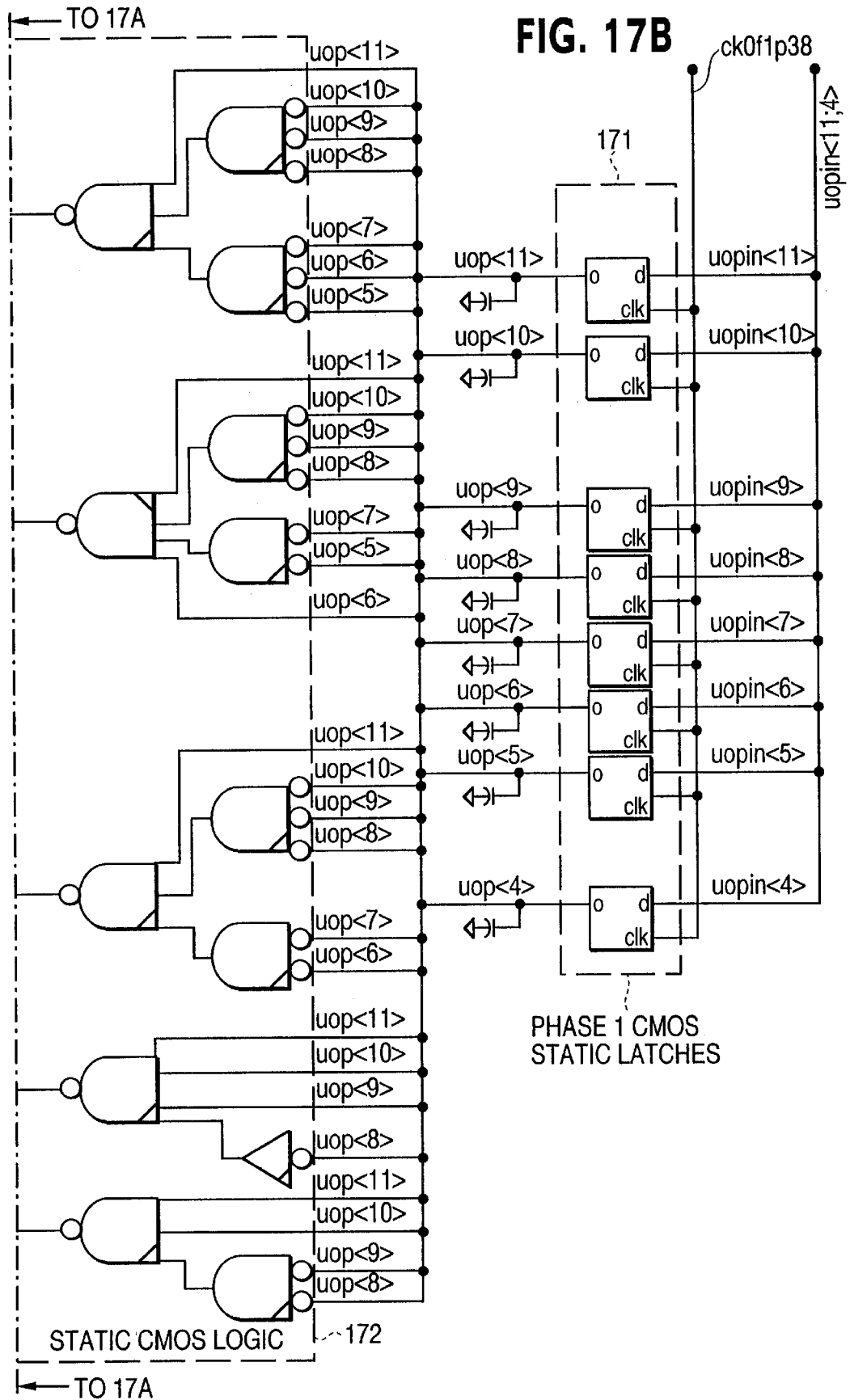

PULSED CLOCK SIGNAL TRANSFER CIRCUITS WITH DYNAMIC LATCHING

FIELD

The present invention relates, generally, to the field of signal transfer clocking circuits and, more particularly, to logic signal transfer circuits employing phase/pulse clocking methodology, including, although not limited thereto, pulsed clock gated logic circuits in processors (e.g., microprocessors).

BACKGROUND

Recently, there has been realized significant achievements in scaling down of the sizes so of active elements in semiconductor integrated circuits (ICs), in the level of integration of an IC chip and, also, in the scaling down of the supply voltages of IC chips, as well as in the voltage/current levels assigned to logic levels of integrated circuits. Such developments have been particularly noticeable in CMOS (Complementary Metal-Oxide Semiconductor) technology, which has led to the development of single-chip processors (i.e., microprocessors) with ever increasing clocking speeds. However, as the channel length Leff (effective channel length) is lowered below 0.2 microns, it becomes more and more difficult to reduce gate delay, due to mobility reduction and series resistance limitations. Therefore, with increasing clock frequency in microprocessors, the clock inaccuracy becomes a significant percentage of the clock period. It is critical, therefore, that we account for the clock inaccuracy in connection with the transfer of data (e.g., logic signals) in the die (processor chip). For example, you may have a global clock tree distribution in which similar generated clocks may not arrive at the end of the distribution clock tree at exactly the same time for a number of reasons, including that the component elements are not perfectly matched throughout the chip. There may be faster components at one location of the chip than at another, or you may have a drop in the power supply at one location of the chip and not at another, which would cause a difference in delay in signal propagation.

Basically, the clock inaccuracy consists of two components, namely, clock skew and clock jitter. Clock jitter can be noticed when monitored on an oscilloscope in which the thickness of the rising edges (bands) represents the extent of excursion of the clock edges from the nominal timings and is referred to as the peak-to-peak jitter. There is also clock skew which represents the spacial separation effect of the clock inaccuracy. An example of this is shown in FIGS. 19A and 19B in which two clocks, namely, ClkA and ClkB, are generated by the same source and are designed for equal delay $T_0$. However, the two paths which include equal numbers of series-connected logic inverters (e.g., CMOS inverters) are disposed over two different locations on the die. For example, assume that path B is laid out next to large bus drivers (with a high activity factor) in which case the supply voltage may be lower than that for the devices in path A, which neighbors only small gates with very low activity factor. Further, assume that the channel lengths of the MOSFETs (Metal-Oxide Semiconductor Field-Effect Transistors) in path B came out to be longer than nominal because of some optical distortion from defects in the lens, while devices in path A were unaffected. Obviously, the delay $T_B$ through path B will be longer than the designed nominal delay $T_0$, while the delay $T_A$, through path A, will be shorter than delay $T_0$. The skew between the two clocks is then the difference $T_B-T_A$, as is clearly seen from the timing diagram in FIG. 19B. In general, skew can also be between two paths of designed unequal delays. Using CMOS technology as an example, there are a number of reasons contributing to clock skew, including but not limited to (1) threshold voltage variation of MOS transistors across the die; (2) interlayer dielectric thickness variation; (3) design errors; (4) supply voltage variation across the die; (5) temperature difference across the die; (6) signal coupling to neighboring lines; and (7) variation in the effective channel length of MOS devices across the die.

With regard to the phenomena of clock skews, the potential for realizing a race condition resulting from min-delay (minimum delay) becomes even more pronounced with attempts at achieving higher and higher processor clocking speeds. For example, assume you have a generator block including a first logic circuit with plural signal paths and a receiver block including a second logic circuit and that each of those blocks is controlled by clock signals generated by different local clock generators. Assume also the presence of clock skew as a result of any one or more of the number of reasons discussed above. Thus, if the local clock generators associated with the first logic circuit generate clock signals faster than that of the local clock generators associated with the second logic circuit, in the receiving block, the signals may arrive at their destination faster than desirable and potentially may race through the receiving block. This can cause inaccurate operation (e.g., glitches or spurous transitions, etc.) of the individual logic circuits and, therefore, of the overall circuitry in the die. In fact, such, min-delay race conditions can adversely affect the development of higher and higher processor clocking speeds.

SUMMARY

A signal transfer clocking circuit has a first stage including a first latch and a first, non-clocking circuit in series therewith. The first latch has a data input and is opened in response to a first level of a pulse clock signal applied thereto to effect transfer of incoming data through the first stage in a first phase of operation of the signal transfer clocking circuit. The signal transfer clocking circuit further has a second stage including a second, dynamic latch and at least a second circuit in series therewith. The dynamic latch has a data input, coupled to an output of the first circuit, and is opened in response to a second level of a same or different pulse clock signal applied thereto as that applied to the first latch to effect a transfer of data generated by the first stage, through the second stage, to at least one succeeding circuit in a second, successive phase of operation of the signal transfer clocking circuit. The succeeding circuit is opened and closed by a clock signal having phase and frequency characteristics linked to that applied to the dynamic latch. (An opened latch refers to a latch in an ON-state, namely, a conducting state; a closed latch refers to a latch in an OFF-state, namely, a non-conducting state.)

BRIEF DESCRIPTION OF THE DRAWING(S)

The foregoing and a better understanding of the present invention will become apparent from the following detailed description of the illustrated embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and is not limited thereto. The spirit and scope of the present invention are limited only by the terms of the appended claims.

The following represents brief descriptions of the drawings, wherein:

FIG. 1 is a logic circuit having pulse clocked dynamic latching according to a first embodiment of a signal transfer clocking circuit of the present invention;

FIG. 2 is an example illustration showing the operation of the circuit in FIG. 1 using examples for the applied clock pulse signals and data at various points (nodes) along the circuit;

FIG. 3 is a logic circuit having pulse clocked dynamic latching according to a modification of the first embodiment of a signal transfer clock circuit of the present invention;

FIG. 4 is a logic circuit having pulse clocked dynamic latching according to another modification of the first embodiment of a signal transfer clocking circuit of the present invention;

Figure 5A:
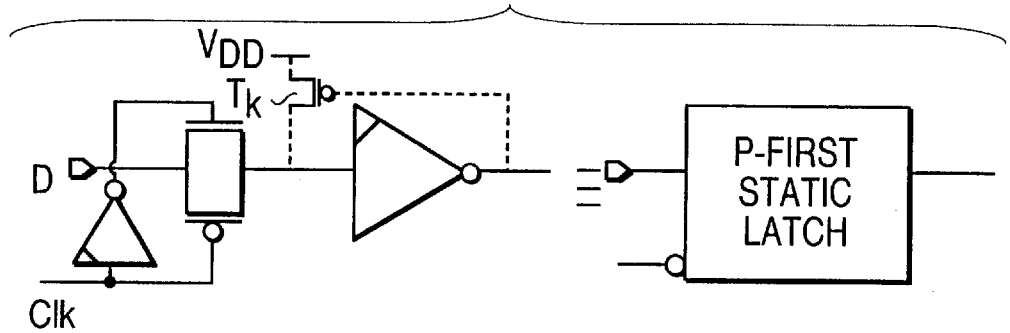
Figure 5B:
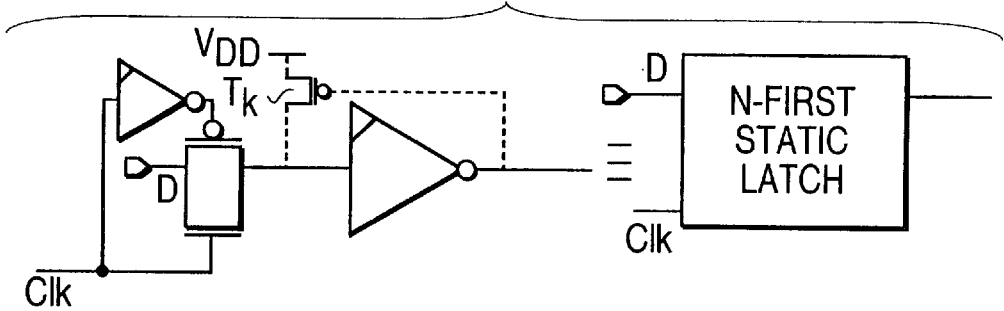
Figure 6A:
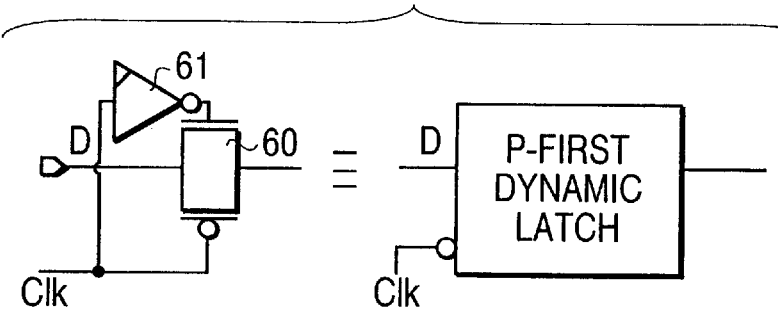
Figure 6B:
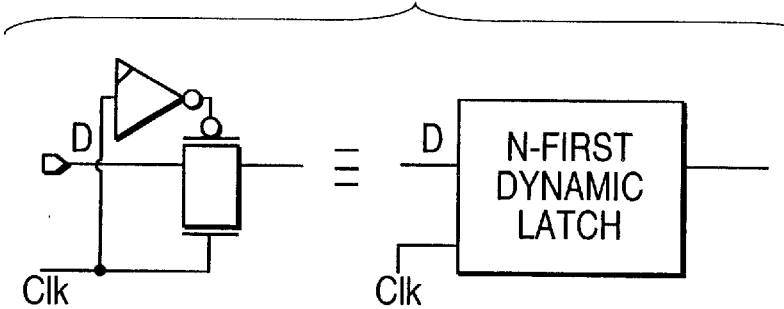
Figure 7:
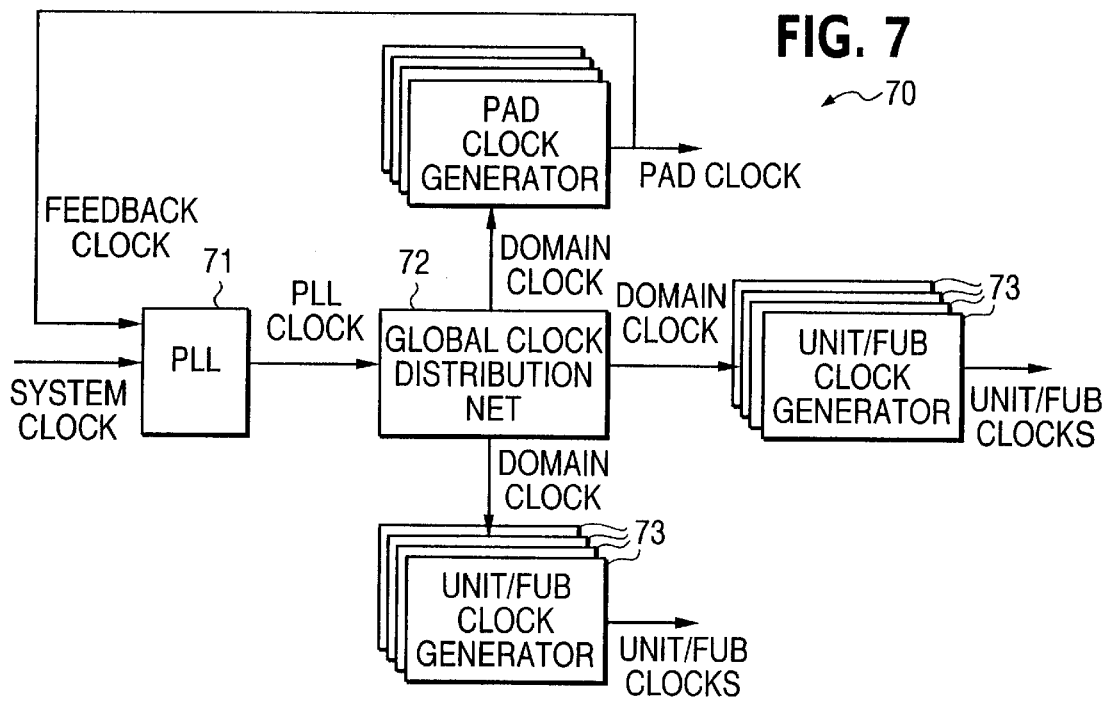
Figure 8:
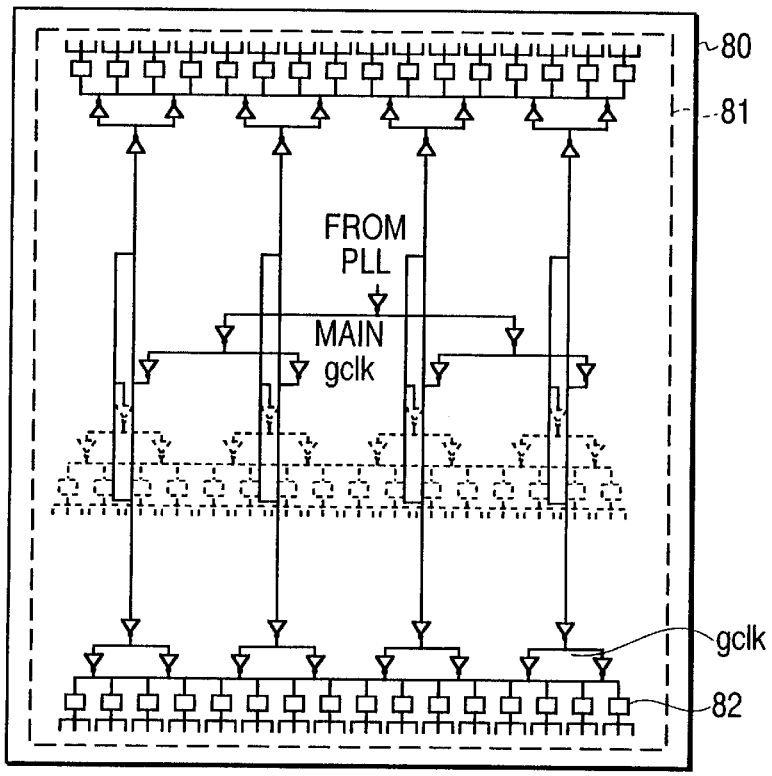
Figure 9:
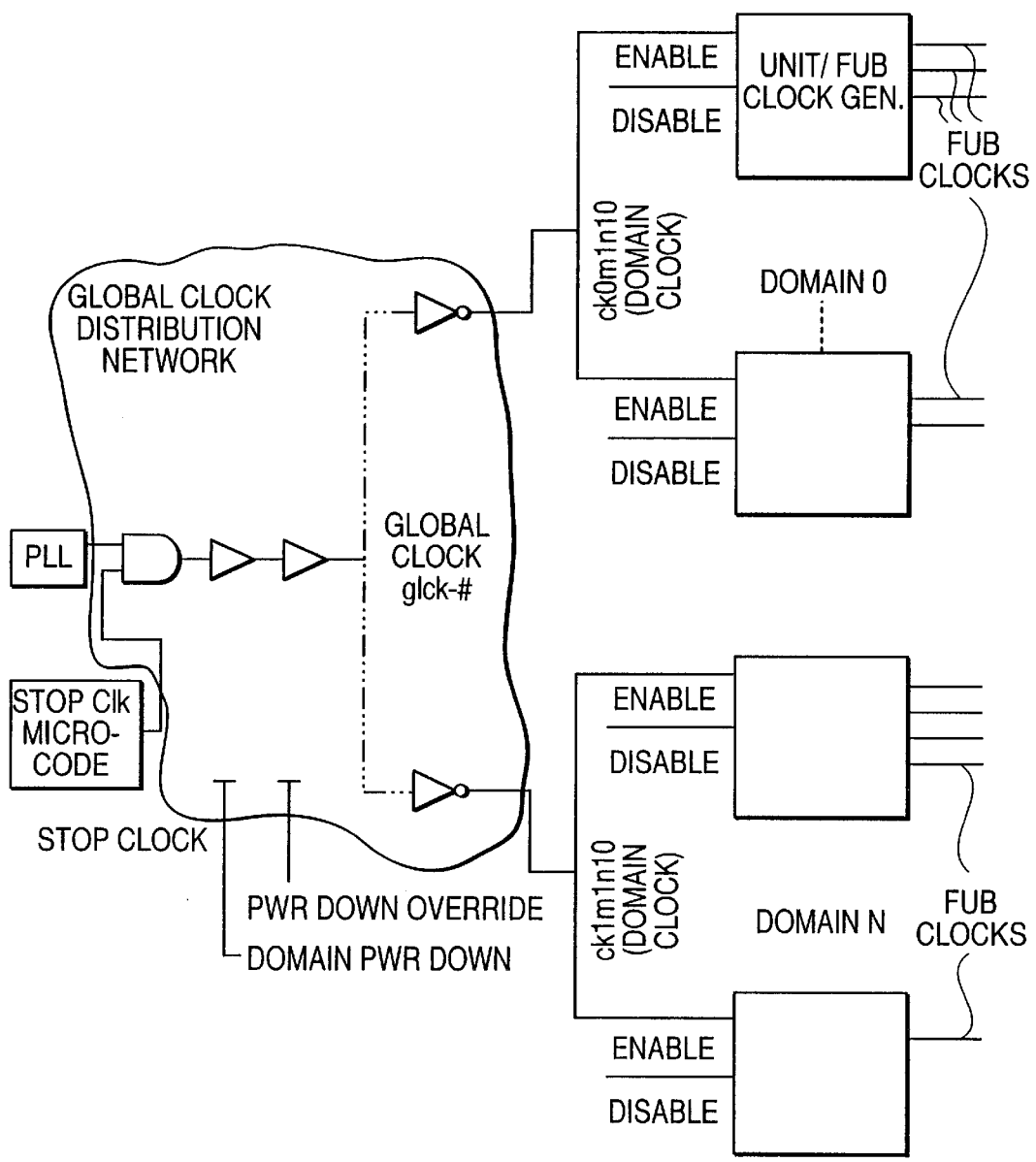
Figure 10:
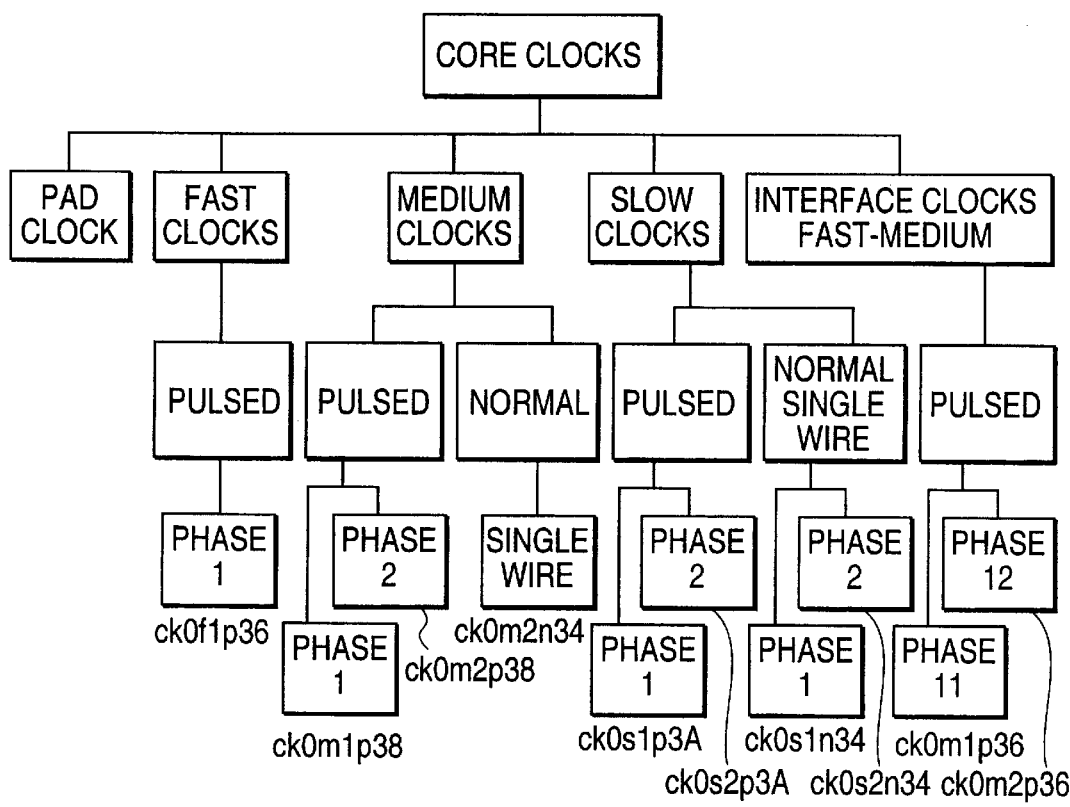
Figure 12:
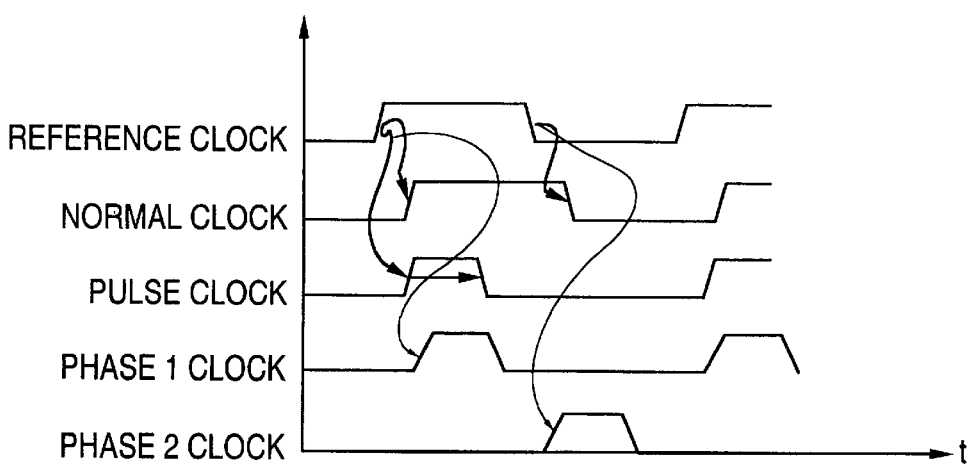
Figure 11:
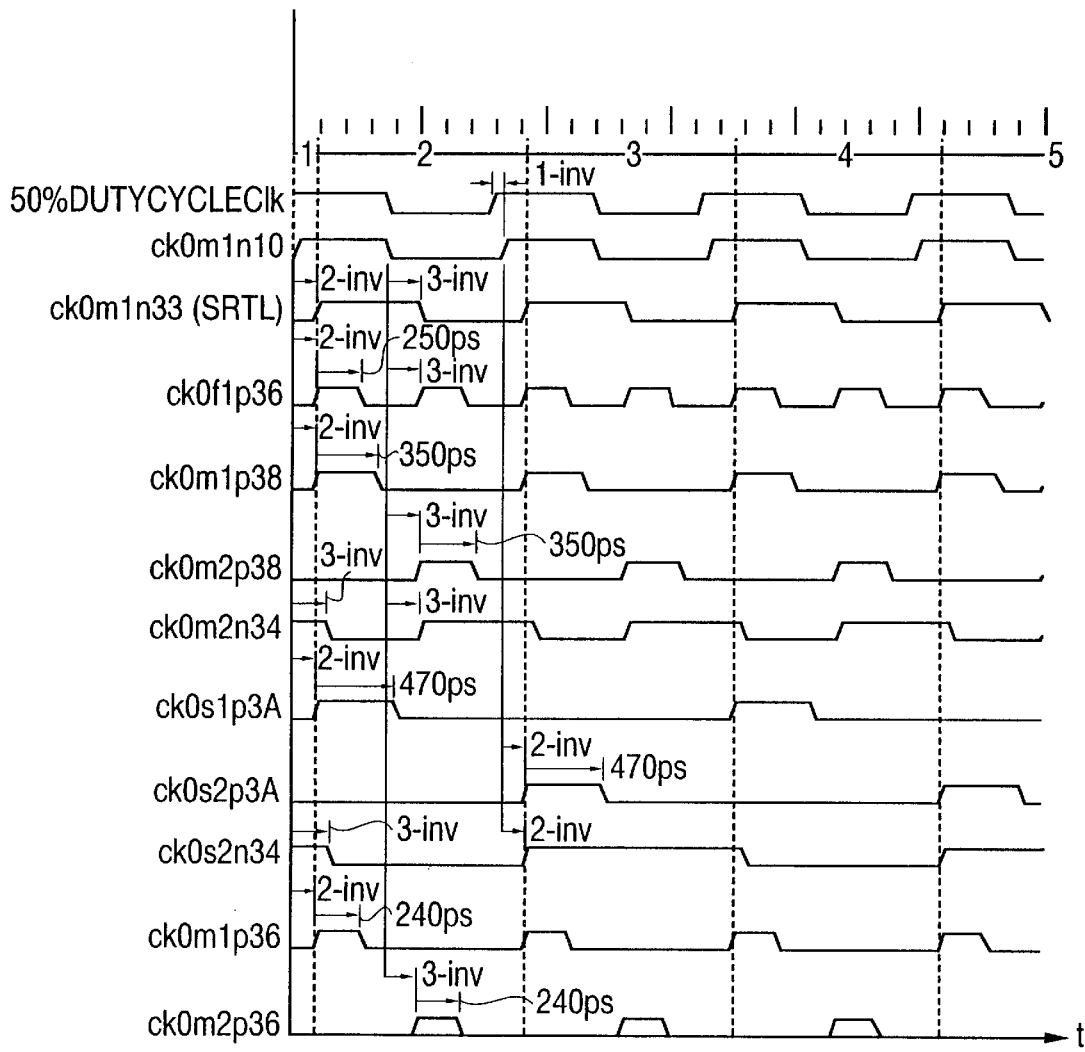
Figure 13:
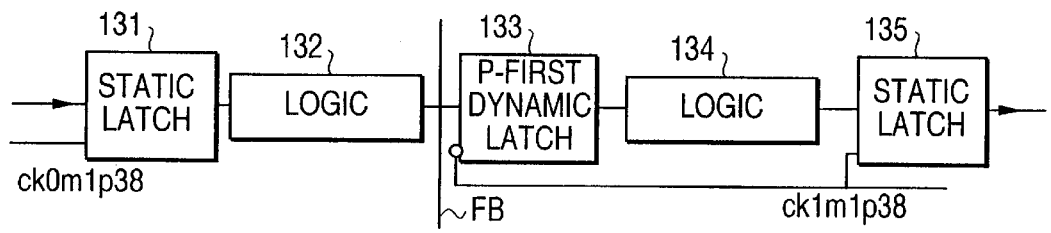
Figure 14:
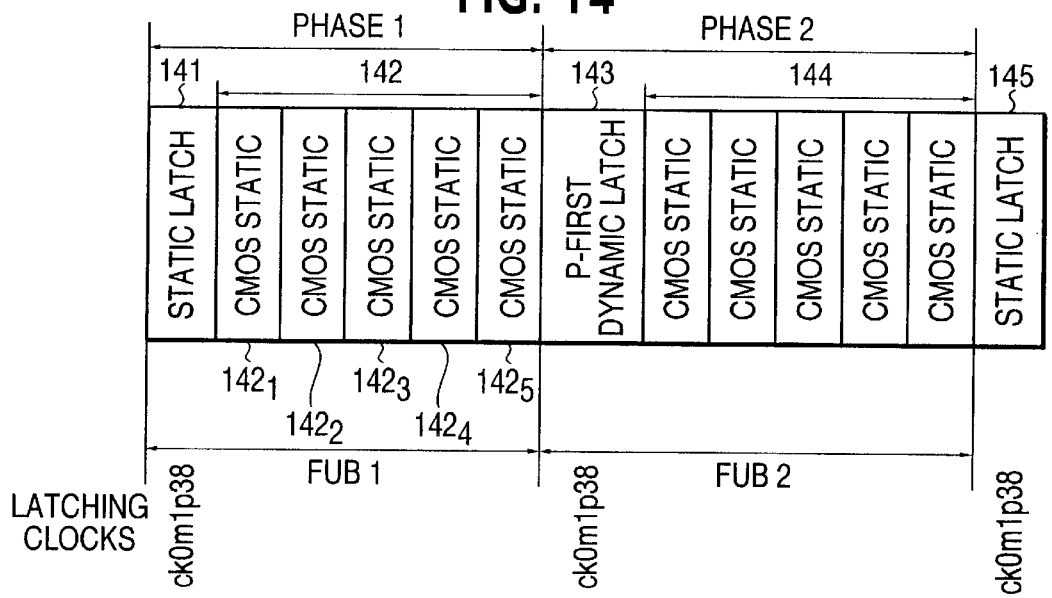
Figure 17A:
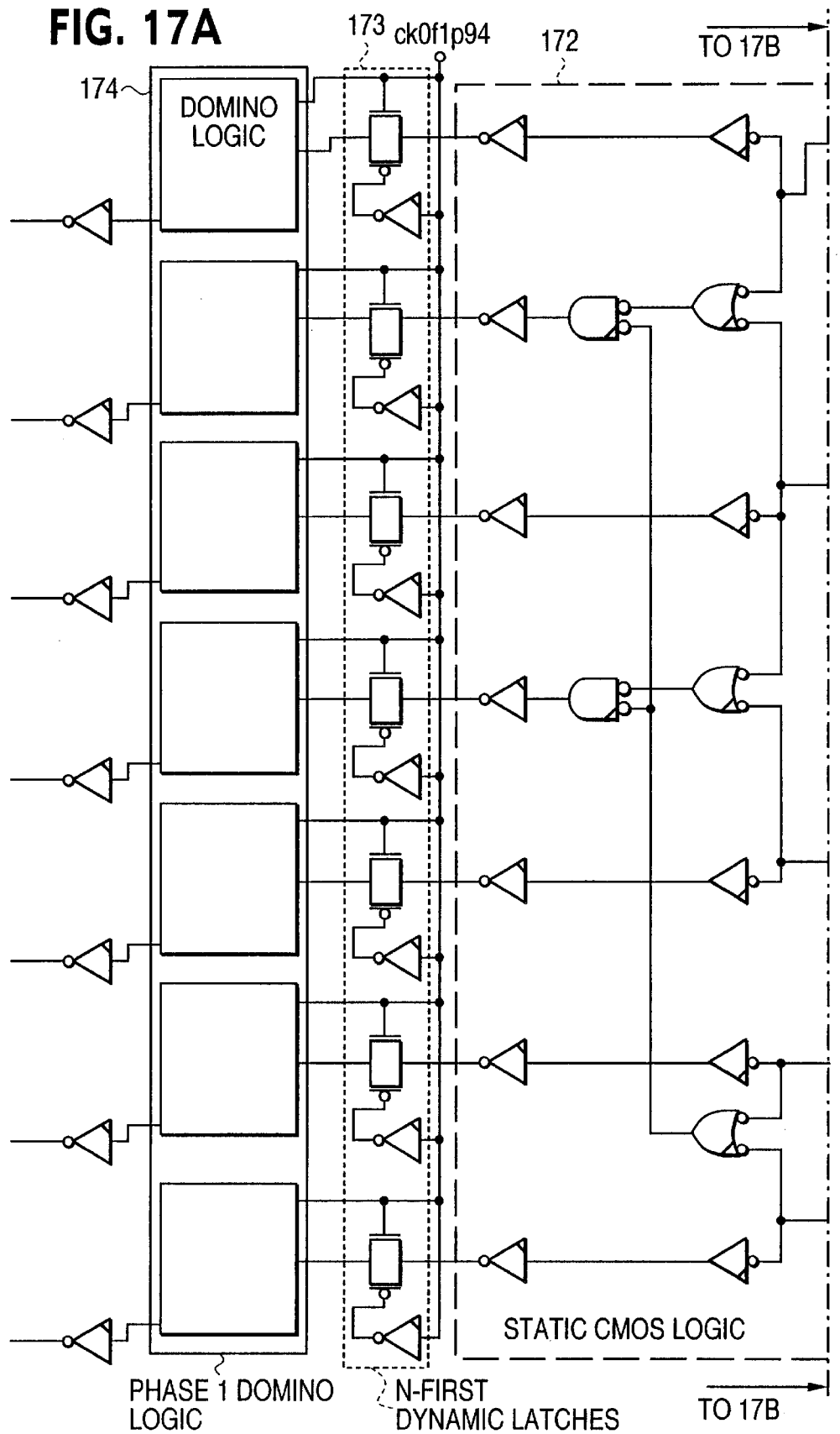
Figure 18A:
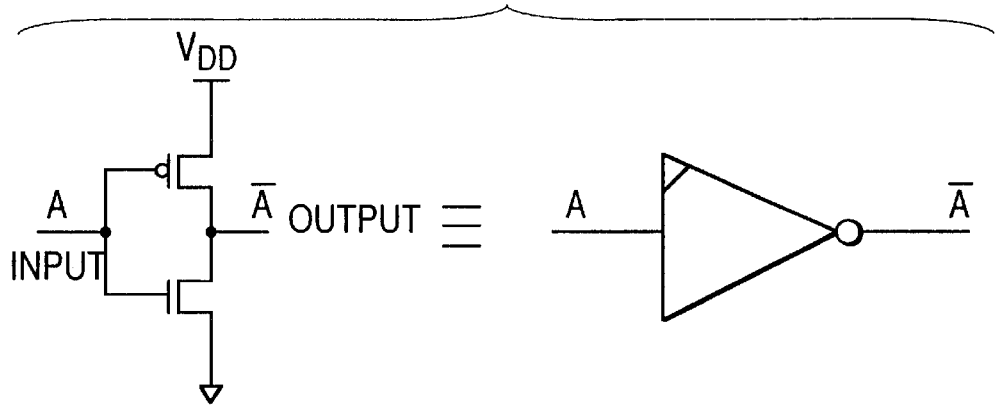
Figure 18B:
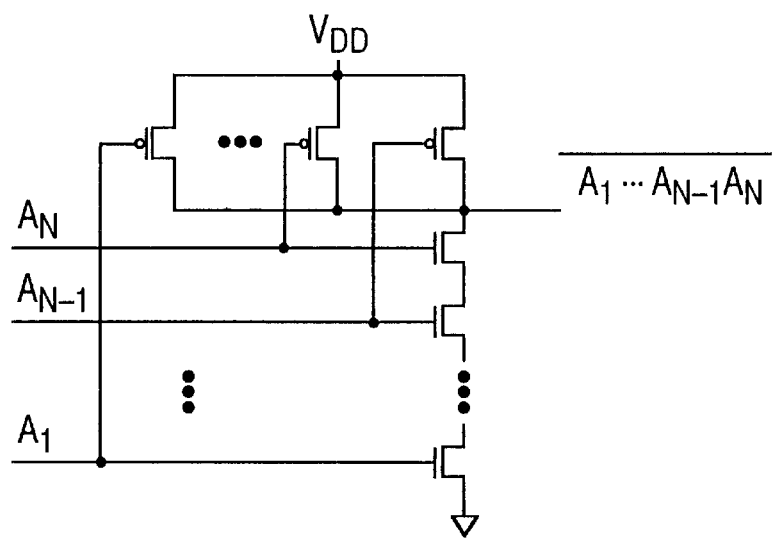
Figure 18C:
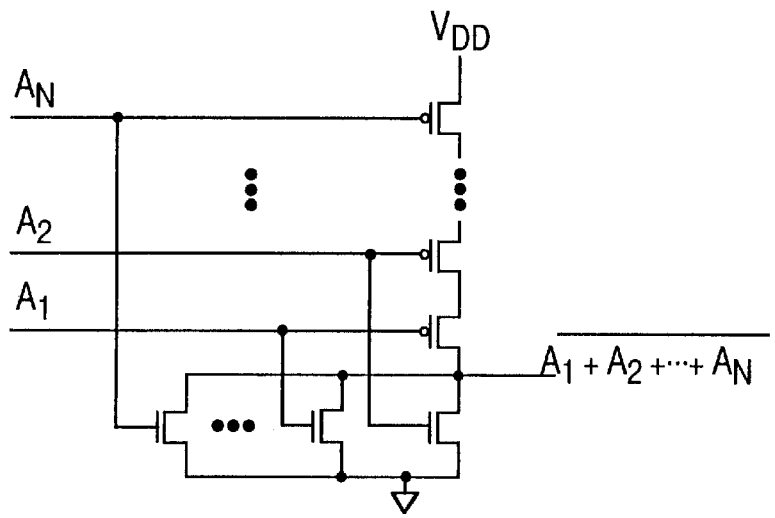
Figure 19A:
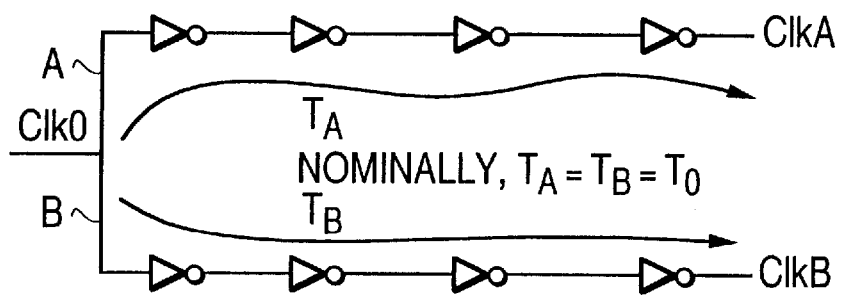
Figure 19B:
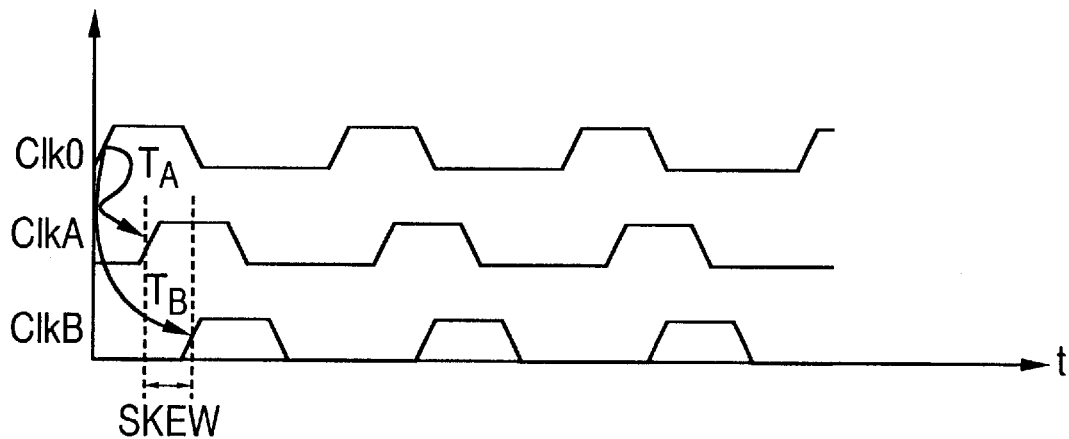

FIGS. 5(A) and 5(B) show examples of a p-first static latch and an n-first static latch, respectively, as applied to signal transfer clocking circuits of FIGS. 1, 3 and 4, as well as in all other examples disclosed in the present application;

FIGS. 6(A) and 6(B) are examples of a p-first dynamic latch and an n-first dynamic latch, respectively, applied to the various examples disclosed of the signal transfer clocking circuit according to the present invention;

FIG. 7 is a conceptual block diagram of a clocking mechanism in a single-chip processor (microprocessor) such as for advanced clocking speeds even up to the GHz range to which the present invention is applicable;

FIG. 8 shows an example of the binary tree for the global clock distribution in a processor chip of the global clocking mechanism conceptualized in FIG. 7;

FIG. 9 shows an example of the general principle of the global clock distribution network and its relation to unit/fub clocks which are used as examples only of clock generators providing the pulse clock signals applicable to the present invention;

FIG. 10 shows examples of the different types of clocks that are associated with the unit/fub clock generators in a global clocking scheme for a high-speed processor to which the present invention is applicable;

FIG. 11 shows an example of waveforms corresponding to the clocks shown in FIG. 10, which relate to the global clock distribution scheme in FIG. 7 of the drawings;

FIG. 12 is an explanatory waveform diagram showing the distinguishing differences between a normal clock signal and a pulse clock signal such as it relates to the various core clocks associated with the clocking scheme to which the present invention is applied to, as one example;

FIG. 13 is an example of a logic circuit having pulse clocked dynamic latching according to a second embodiment of a signal transfer clocking circuit of the present invention;

FIG. 14 is an example of a logic circuit having pulse clocked dynamic latching according to a third embodiment of a signal transfer clocking circuit of the present invention;

FIG. 15 is an example of a logic circuit having pulse clocked dynamic latching according to a fourth embodiment of a signal transfer clocking circuit of the present invention;

FIG. 16 is an example of a logic circuit having pulse clocked dynamic latching according to a fifth embodiment of the signal transfer clocking circuit of the present invention;

FIG. 17(a)–17(b) are an example of a logic circuit having pulse clocked dynamic latching according to a sixth embodiment of a signal transfer clocking circuit of the present invention;

FIGS. 18(A), 18(B) and 18(C) show examples of a CMOS inverter, a CMOS NAND logic gate and a CMOS NOR logic gate, respectively; and FIGS. 19A and 19B are an example of a schematic circuit diagram and a corresponding waveform diagram, respectively, of a two path clock signal generator with clock skew therebetween.

DETAILED DESCRIPTION

In the detailed description of the disclosed embodiments, in terms of relating the same to the present invention, it should be noted that like reference numerals/characters in different drawing illustrations are used to designate identical, corresponding or similar components. Further, the drawing illustrations are not drawn to scale and, also, well-known power connections, as well as other circuit components, which are connectable to the embodiments illustrated, are not all shown within the various examples of the invention illustrated for simplicity of illustration and discussion, and so as not to obscure the invention. It should also be noted, the examples disclosed (described and illustrated in this application) are not limited to the clock signals or circuits employed herein nor to a processor (microprocessor) which employ such a global clock distribution scheme as that mentioned herein. Also, although the examples used herein feature CMOS type construction, namely, CMOS static/dynamic latching, CMOS logic gates (CMOS gates), etc., which typifies that in Intel processors, it should not be considered as being limited thereto.

FIG. 1 is a first embodiment which features a signal transfer clocking circuit 10 as one example, namely, a logic circuit having a pulse clocked dynamic latch which provides a skew-tolerant operation. According to this circuit, min-delay (minimum delay) race violations are prevented through employing a dynamic latch such as a p-first dynamic latch 13 which is, in this example, a simple CMOS clock transmission gate, although not limited thereto. The dynamic latch is referred to as a p-first dynamic latch because the pulse clock ck0m1p38 is asserted on the P-side of the dynamic latch, that is, pulse clock ck0m1p38 is directly applied to the P-channel MOSFET while the complement thereof is applied to the N-channel MOSFET of the CMOS transmission gate. This is depicted in FIG. 6A of the drawings in which the do CMOS transmission gate (or simply CMOS gate) is represented by reference numeral 60 and a CMOS inverter is represented by reference numeral 61. According to this example, when pulse clock ck0m1p38 is at a logic high level (or level H), the p-first dynamic latch 13 is closed, i.e., it is in a closed mode, namely, a non-conducting (OFF) state. That is, data signals are prevented from propagating through the p-first dynamic latch 13. Only when the p-first dynamic latch is opened, i.e., it is in an open mode, namely, a conducting (ON) state, can any of the signals from the first phase of the logic operation propagate through the second stage (which is inclusive of the p-first dynamic latch 13 and the logic circuitry in block 14) to a succeeding stage which is inclusive of static latch 15 and any logic circuitry associated therewith. It is important that the circuit is provided with a p-first dynamic latch from the standpoint of not wanting to have signals propagating too fast to the circuitry at logic block 14 and, therefore, also, through static latch 15, to any other receiving stage. This p-first dynamic latch blocks logic signals from propagating through the rest of the logic circuitry too quickly.

According to the invention, only when the dynamic latch (e.g., CMOS gate) is opened will any of the signals from the preceding gates including the first stage thereof, which is inclusive of the static latch 11 and logic block 12, propagate to the second stage and any further succeeding stage. Said differently, the p-first dynamic latch 13 delays transmission of the fastest arriving signals until the relatively slower signals have also arrived. You want to make sure that the slowest propagating logic signals will have reached their destination in a timely manner. Therefore, through employing a scheme such as that illustrated in FIG. 1 of the drawings, min-delay race violation can be minimized or, practically speaking, substantially prevented. Typically, in a die there exist both fast and slow paths running through logic circuitry and in the case of a max-delay (maximum delay) race you are concerned about the slowest paths and in the case of min-delay (minimum delay) racing of signals, you are concerned about the fastest propagation path. The purpose of the dynamic latches, according to the present invention, which are, for example, clocked CMOS gates (or clocked CMOS transmission gates), is to minimize racing violations, namely, minimize min-delay race violations. In this connection, you do not want the signals (i.e., fast signals) changing state too quickly since this would lead to propagation errors (e.g. glitches, etc.) of the data being transmitted to subsequent stages as well as undesired excess consumption of power.

In FIG. 1, you will note a vertical line FB, which refers to a fub boundary. This is an imaginary line and is simply a representation that the left side and right side portions thereof represent separate blocks of circuitry or separate functional units in the die, in which each such separate circuit or functional unit has its own phase/frequency clock requirements. Accordingly, each such block of circuitry or functional unit has its own separate clock generated by a local clock generator, namely, a unit or fub clock generator. Such need for a fub clock can arise in semiconductor chips having large numbers of circuits with specific clocking requirements, especially, in microprocessors. Typically, a main timing generator is employed in semiconductor chips through which a number of different clock signals are produced, either at the same or at different locations on the die. In microprocessors, global clock distribution schemes are employed with regard to the implementation of large numbers of clocks for operating the processor. In order to see this more clearly including in terms of the example given in FIG. 1 of the drawings, as well as with regard to the examples in the other embodiments disclosed in this application, the following discussion directed to a clock distribution scheme of microprocessors is being provided.

FIG. 7 of the drawings is a block diagram conceptualizing a clocking mechanism in a single-chip processor (microprocessor) such as for advanced clocking speeds (in present as well as the next and future generation processors) even up to the multiple GHz range to which the present invention is applicable. This processor clock network 70 consists, essentially, of three major blocks: (a) the PLL (phase-locked loop) block 71 which synthesizes the chip clock from an OFF-chip system clock, (b) the global clock distribution block 72 which distributes the clock generated in the PLL block to all of the units and fubs and (c) a unit and fub clock generator 73 which generates the appropriate style, frequency and phase of clocks for the fub. The global clock distribution network 72 is part of the global clock unit, whereas the unit/fub clock generators are part of the individual units which may be remotely situated therefrom, on the die. According to such a scheme, the global clock signal (gclk#signal) is partitioned into a large number of domain clocks, although only a small number are shown for purposes of illustration in FIG. 7 of the drawings. Each unit (fub) receives one or more domain clocks for generating local fub clocks, in which one or more units can be associated with the same domain clock. In fact, each domain clock can be considered as a global clock (gclk) within that domain since it can be associated with a plurality of unit/fub clock generators. This can be seen with regard to the binary tree 81 for the global clock distribution of a microprocessor 80 in FIG. 8 of the drawings, in which 82 represents a unit/fub clock generator and gclk represents a local global clock signal, and from FIG. 9 of the drawings, the latter showing, through a simplified clock network diagram, the concept of using a domain clock to generate a plurality of fub clocks.

From these general diagrams, which are to be considered as an example showing of the concept of global clock distribution for a large number of domains in an advanced generation processor chip, applicable to the present invention, delay path balancing can be maximized therefor, although up to a point. That is, propagation delay path imbalances throughout the entirety of the clocking network can be minimized through using balanced tree topologies, such as shown in FIG. 8, rather than simply cascaded or chains of topologies. However, as the demand for greater and greater clocking speeds of ordinary memory chips and the like and, in particular, of microprocessors increases, any such slight differences in the formation of different signal lines carrying logic signals or clock signals, including with regard to the environmental condition at the portion of the chip or die associated with those signal lines, can lead to min-delay race conditions which must be treated in order to avoid problems such as glitches, which is a spurious transition resulting from an imbalance in the paths of the input signals of, for example, a single CMOS gate or any CMOS combinatorial logic block, in general. With regard to the FIG. 9 diagram, clock ck1m1n10 is one representative example describing a domain clock. Such domain clock can be associated with one or a group of unit/fub clocks including, for example, pulse clocks ck0m1p38 and ck1m1p38 of FIG. 1, the latter two having the same phase and frequency characteristics but are associated with separate fub clock generators. However, because of possible slight differences in propagation delays between the signal lines associated therewith, the pulse clock signals of these fub clocks may not start at exactly coincident times. In fact, even relative delays in the single-digit picosecond (ps) range become noticeable as processor clocking speeds become higher and higher. The alphanumeric convention used in describing the domain clocks as well as the fub clocks, such as those being used with regard to the example embodiments disclosed herein, will be described with regard to FIGS. 10 and 11 of the drawings.

FIG. 10 is an example illustration of the core clocks associated with an advanced microprocessor clocking scheme to which the present invention is applicable, although not limited thereto. Examples of the noted fub clock signals and their relationship to a reference clock and a corresponding domain clock ck0m1n10 of such a clocking scheme are shown in the waveform diagram in FIG. 11 of the drawings. Take for example the domain clock signal ck0m1n10. The ck0 identifies which domain or group of unit/fub clock generators it relates to; the letter m refers to a medium frequency clock signal in that processor, the numeral 1 following the letter m is indicative of a phase 1 clock, the letter n identifies that it is a normal clock, the numeral 1 in number 10 identifies the number of inverted gate delays of the leading edge of that domain clock from the leading edge of the 50% duty cycle reference clock while the 0 in the number 10 is indicative of the number of inverted gate delays of the falling edge of this domain clock from the falling edge of the reference clock. Similarly, pulse clock signal ck0m1p38, which is used in the example in FIGS. 1, 3, 4, etc., in the drawings, is explained as follows. ck0 is a uniquely identified clock signal of a unit/fub clock generator associated with a domain having the just-described clock ck0m1n10. The letter m represents a medium clock frequency, numeral 1 indicates that it is a phase 1 type signal, the letter p identifies this clock signal as a pulse clock signal, numeral 3 represents the number of inverted gate delays of the rising (leading) edge from the rising (leading) edge of the reference clock and the number 8 represents the number of inverted gate delays of the trailing edge of this clock from rising (leading) edge of the reference clock. In terms of understanding this more clearly, FIG. 12 is provided as a showing of the differences in meaning between that of a normal clock, pulse clock, phase 1 clock and the phase 2 clock. As one can clearly see, a normal clock is one in which the rising (leading) and falling (trailing) edges of that clock are generated off of the leading and trailing edges of a corresponding reference clock, respectively. The pulse width of the normal clock, therefore, is a function of the pulse width of the reference clock. On the other hand, a pulse clock is one in which the rising and falling edges of that clock are generated off the same edge of the reference clock. Therefore, the pulse width of the pulse clock is not a function of the pulse width nor of the frequency of the reference clock. That is, a pulse clock can be considered as being a one-shot clock reference from one of the leading and trailing edges of a reference clock. The above-referred-to domain clock can be considered as one of a number of global clocks of that processor. Incidentally, normal clock signal ck0m1n33 is a 50% duty cycle clock used in SRTL (Structural Register Transfer Logic), i.e., it is specific to the logic architecture.

In FIGS. 10 and 11 you will note clock signals with the letters s, m and f. They represent the frequency identifiers of those clocks. For example, the letter s corresponds to a slow clock which can mean 450 MHz clock associated with an advanced generation processor developed by Intel or 300 MHz clock with regard to a relatively lower speed processor. The letter m is indicative of a medium frequency clock such as 900 MHz clock, with regard to the advanced generation processor, or a 600 MHz clock, with regard to the relatively lower speed processor. The letter f is indicative of a fast clocking speed such as 1.8 GHz clock with regard to the advanced processor or 1.2 GHz clock with the less advanced speed processor. Examples of these are depicted in FIG. 11 of the drawings, in which the pitch associated with the vertical markings at the top end of the diagram corresponds to two inverter (of the CMOS type) gate delays, as one example. It should be noted, each new generation of processors changes the ranges of frequencies associated with slow, medium and fast clocks. The values given herein are strictly examples only and are not to be considered as being limited thereto.

There are a number of reasons for having separate domain clocks. For one, it may be desirable for different parts of the processor, for example, different portions of a pipeline of stages, to be enabled at different times. That is, you may want to sequentially turn clocks on and off in order to save power, i.e., using clocks only when they are actually doing work and not just running all the time. Also, it may be difficult to maintain the same clock to have the same characteristics in view of distances between fubs. That is a basic reason why global distribution of clocks is in the form of a clock tree, as described earlier. For example, clocks arriving at near the ends of that distribution clock tree may not arrive at exactly the same time as that of similarly corresponding clocks because of, for example, a mismatch of devices (e.g., faster/slower devices on different sides of the chip) or droops in power supply at one side of the chip and not in the other side of the chip, etc. Such undesirable influences result in clock skews which are reflective of delays in signal propagation times. When clock skews occur, there is a greater propensity for occurrence in a race condition (e.g., minimum delay race violation). If a first clock generator which controls an upstream pipestage is generating the clock faster than a second clock generator which controls a downstream pipestage, it means that the signals are going to arrive at the downstream pipestage faster than desired. This can potentially result in racing through the receiving latch of the downstream pipestage. Therefore, margins are needed in order to protect the circuit operation against those kinds of races. This is where use of a dynamic latch, such as a basic CMOS transmission gate (or, simply, a CMOS gate), can guarantee the necessary delay up to that point in time to prevent racing through subsequent stages along the pipeline of logic signal/data transmission. That is, nothing can be transmitted faster than the cycle time of the pulse clock signal of the strategically placed dynamic latch. Incidentally, the benefits of using a CMOS type dynamic latch are also considerable. For one, the number of components employed is relatively low when compared to other types of latches. Secondly, by using a CMOS gate, in which the P-and N-channel MOSFETs are connected in channel-to-channel parallel, the ON-resistance is minimal. Thirdly, a CMOS gate can pass both a logic high and a logic low data signal without any threshold voltage drop. That is, effectively, there is no loss of signal during the open mode of a CMOS gate.

Turning again to the example of the invention featured in FIG. 1 of the drawings, the p-first dynamic latch 13 is employed to lock off any signal transmission from propagating to the logic block 14 and to the succeeding, receiving fub which, in this example, is opened using a static latch 15. According to the present invention, application of a dynamic latch such as a p-first dynamic latch 13, which is typified by a clock CMOS transmission gate, although it is not to be considered as being limited thereto, for performing a fully latching function is quite advantageous in terms of component transistor elements needed, as noted above, and the fact that it is amenable to pulse clocking. That is, a fully latching function can be achieved through using a dynamic latch such as a CMOS gate because of the availability of pulse clocking. On the other hand, employing a latching scheme responding to a symmetric phase 1 and phase 2 normal clock, the closing/opening of a latching gate would be limited only to either the first or the second phase of the normal clock. Through using pulse clocks, however, the clock could be stopped during either the phase 1 or the phase 2. Clock signal ck0m1p38 is a pulse clock associated with the generating fub (corresponding to the left portion of the fub boundary FB) and clock signal ck1m1p38 is applied to the receiving fub (corresponding to the right portion of the fub boundary FB) in FIG. 1. From the earlier explanation, these clock signals are medium frequency pulse clock signals and have the same phase and frequency but which are associated with different domain clocks.

As you can see from FIG. 2 of the drawings, the pulse clock ck1m1p38 applied to the receiving fub may be somewhat delayed such as by one inverted gate, as one example, although not limited thereto, as a result of the presence of a clock skew associated with the global clock/domain clock signal network thereof. Assuming a data signal d0 arrives at the input side of the n-first static latch about two CMOS inverter gate delays subsequently to the leading edge of pulse clock ck0m1p38, as shown in FIG. 2, examples of arrival times as it relates to signals d2, d4 and d5 in FIG. 1 are shown in FIG. 2, although not limited thereto. From FIG. 2, it is noted that p-first dynamic latch 13 does not become open (set in an ON-state) until the logic signals have arrived to logic block 12. Also, the pulse width associated with the ON-state of p-first dynamic latch is sufficiently wide to cover any inverted gate delay associated with logic block 12, for example, up to 6 gate delays, when using a clocking scheme of a medium speed and pulse width as that shown and as explained earlier, although not limited thereto. From FIG. 2, the data d5 does not arrive until the next pulsing of clock pulse ck1m1p38, which is slightly delayed from the ck0m1p38 clock pulse. From FIG. 2 of the drawings, one can clearly see that p-first dynamic latch 13 minimizes any racing between the generating portion and the receiving portion of logic circuits and the like in the die.

As explained earlier, FIGS. 5B and 6A are examples of n-first static latch and p-first dynamic latch of the CMOS variety employed in the embodiment of FIG. 1, although not necessarily limited thereto. Similar results can also be achieved through using a p-first static latch and an n-first dynamic latch of the CMOS variety, such as illustrated in FIGS. 5A and 6B in place of the n-first static and p-first dynamic latches of FIG. 1, respectively. Such a modified example is illustrated in FIG. 3, in which blocks 11'–15' of signal transfer clocking circuit 10' correspond to the similarly numbered blocks in FIG. 1. As a further modification of FIG. 1, both the static latch as well as the dynamic latch can be of the N-type in which case a logic inverter such as of the CMOS type, although not limited thereto, would separate the incoming clock signal applied to the gate of the N-channel MOSFET of the dynamic latch with that applied directly to the N-channel MOSFET of the static latch. This can be seen with regard to FIG. 4 of the drawings in which blocks 11"–15" of signal transfer clocking circuit 10" correspond to the similarly numbered blocks in FIG. 1. Likewise, rather than both the static as well as the dynamic latches being of the n-first type, they can both be of the p-first type with an inverter separating the application of the clock pulse to the respective P-channel MOSFETs thereof. Similarly as with regard to the embodiment in FIG. 1 of the drawings, the modified versions thereof in FIGS. 2 and 3 operate in a similar such manner as that shown by the waveforms in FIG. 2 of drawings, although not limited thereto.

With the dynamic latch clocking methodology employed herein, the logic circuitry of the generating portion, for example, logic block 12, can consist of static logic gates such as of the CMOS variety, although not limited thereto. Logic block 12 can also be in the form of any CMOS combinatorial logic circuit and in the case of frequencies such as that discussed above, as one example, there can be up to 6 gate delays, covering propagation through the static latch 11 in conjunction with the logic block 12. Also, rather than having a static latch 15 which is similar to that of static latch 11, dynamic logic circuits such as of the domino logic circuit variety can also be used. In fact, a domino logic circuit can be used in place of static latch 15 and any combinatorial static logic circuits of that receiving fub.

It should also be emphasized, according to the present invention and consistent with FIGS. 1, 3 and 4 as well as with regard to the further embodiments to be subsequently discussed, a phase 2 clock is not required because the dynamic latch is driven from the phase 1 pulse clock. Also, dynamic latch 13 can be driven either by the generating clock ck0m1p38 or, for that matter, by the pulse clock ck1m1p38 of the receiving fub. This is depicted in FIG. 13 of the drawings in which, it is noted, the fub boundary between the generating and receiving portions is at the input side of the p-first dynamic latch. FIG. 13 similarly shows first and second stages in which a first stage is inclusive of static latch 131 and logic block 132 and the second stage is inclusive of p-first dynamic latch 133, logic block 134 and static latch 135. With regard to this embodiment, the dynamic latch has its clock coming from the receiver side clock generator, which is actually a safer solution for minimizing min-delay race violations. In fact, it is actually a more preferred solution in that you are guaranteed, for all practical purposes, to prevent any racing. This is because the local clock generator or fub clock generator as well as wiring connections at the receiver side (i.e., to the right of fub boundary) including that pertaining to the clock input of the CMOS transmission gate of the dynamic latch 133 are localized within the receiver side. In this connection, it is noted that the fub clock ck1m1p38 of the static latch 135 is also directly applied to the P-channel MOSFET of the p-first dynamic latch 133, which is also located on the receiver side.

Another example which can be considered as somewhat closely related to that of FIG. 13 is illustrated in FIG. 14 of the drawings. According to the embodiment in FIG. 14, 141 represents a static latch, 142 and 144 can be considered as logic blocks each consisting of five CMOS static gates (e.g., $142_1, \ldots, 142_5$). Alternatively, each CMOS static gate can constitute a separate logic block. This embodiment also includes a p-first dynamic latch 143 (associated with the second phase of operation of the clocking circuit but which is clocked by a phase 1 clock pulse) and static latch 145, similarly as that depicted in FIG. 13 of the drawings. In FIG. 14, however, the p-first dynamic latch 143 is opened/closed by a fub pulse clock tied to either the sender or receiver phase 1 clock pulse, the sender phase 1 clock pulse opening/closing static latch 141 while the receiver phase 1 clock pulse opens/closes static latch 145. As you can see from this illustration, the first phase is limited to a gate delay of six CMOS static inverting circuits, five of which correspond to logic portion 142 and the sixth of which is included in the static latch 141, such as shown in FIGS. 5A and 5B, although not limited thereto. That is, the six inverter gate delays associated with the sender phase 1 operation is about one phase worth of logic, i.e., the six inverter gate delays are the number of gate delays that can be combined into one phase worth of logic signal flow. This is consistent with that permitted by medium frequency type clock domains such as that corresponding to the present examples. With regard to FIG. 14, the latch is a p-first dynamic latch (i.e., a pass gate such as a CMOS transmission gate only [without the keeper], with the P-channel MOSFET of the pass gate connected directly to the input clock). As to the fub boundaries, in terms of effecting a proper allocation of clocks to individual fubs, the determination is often made on the basis of how the logic circuitry is divided along the fub boundary. With regard to FIGS. 1, 3 and 4, noting that the dynamic latch 13 is associated with the generating fub, which may be considerably distant from the receiving fub clock generator, it would be impractical to route the receiving pulse clock ck1m1p38 to the dynamic latch 13 of the generating fub. On the other hand, the dynamic latch 133 in FIG. 13 can be clocked by the pulse clock of the receiving fub noting that its proximity is more in line with the receiving fub. That is, the boundary is naturally occurring before the p-first dynamic latch; therefore, an effective practical connection can be made from the receiving pulse clock generator to the p-first dynamic latch. Generally, the boundary (fub boundary FB) is defined by where the circuit components separate in terms of clock signal requirements. Therefore, noting that a different clock generator (local clock generator or fub clock generator) is employed on the receiving side, the natural boundary is at the dynamic latch.

FIGS. 15 and 16 are other examples featuring the present invention. With regard to FIG. 15 which contains static latch 151, logic block 152, p-first dynamic latch 153 and logic block 154 as well as static latch 155, associated with the succeeding circuit, you have a situation where the dynamic latch, namely, p-first dynamic latch 153, does not appear to belong to either the generating (or sending) fub or the receiving fub. In fact, it may correspond to a totally separate fub, for example, an intermediately positioned fub, on the die. For example, let us assume that the generating clock is associated with one fub and the receiving clock is over in another fub which can be at an intervening position. In other words, the second stage (inclusive of p-first dynamic latch and logic block 154) is dependent, on the one hand, on the clock tied to the first or generator fub while, on the other hand, is also dependent on a second and/or third fub pulse clock. In FIG. 16, however, the invention is featured somewhat differently. Namely, the output logic signals from the generating fub are spread into plural-channel logic circuits (in the present instance, the single logic transmission path is split into two paths on the receiver side). As is clearly shown, this scheme employs two pulse clocks on the receiver side. The question that is then posed is which of these two clocks, namely, pulse clock ck1m1p38 and pulse clock ck2m1p38, which may be linked to the same or different domain clocks, is used to open the p-first dynamic latch 163. According to this methodology, however, either of these receiver phase 1 pulse clocks can be used to open the dynamic latch 163. That is, the presence of the double gate delay Oring circuit 168 increases, i.e., it widens, the setup time at the input side of the dynamic latch 163. The amount of delay associated with the Oring circuit 168 is determined by how much logic is associated with one phase versus the other phase. Therefore, if the amount of logic operations to be performed with regard to the phase 1 side is substantially greater than that over on the phase 2 side, it would be advantageous to delay the pulse clock supplied to the gate of the P-channel MOSFET of the p-first dynamic latch 163 by a couple of gate inversions so that the logic signals being transmitted through the phase 1 side have more time to propagate through the p-first dynamic latch before it is closed (set in an OFF-state). Said differently, this delayed Oring also has the effect of increasing the duty cycle associated with the receiver side clock and this, of course, would keep the p-first dynamic latch open for a longer period thereby permitting more time for the logic signals to be propagated therethrough to the phase 2 side. Herein, also, it is noted that all clock signals are phase 1 pulse clock signals.

A good application for circuits such as that disclosed herein in microprocessors, for example, would be in connection with decoder circuitry providing select signals for a MUX (multiplexer). For example, let us say, you have a data path and there is a certain multiplexer which controls the flow of data through selection of either signal path A or signal path B. You would therefore have a decoder which sends out control signals for latching the selection of the data path by steering them to the appropriate MUXs (multiplexers). Such latching is effected over multiple pipestages, for example, distributed around the chip to effect control of different portions of the chip. This is known as UOP (micro operation or microop). This is associated with providing control signals which are used to control the data path or, in effect, to control a data path itself. As another example, let us assume you have an ADDER circuit and this ADDER circuit is effected using static logic. Using the advantages of the present invention, you would want to insert some of the p-first dynamic latches (or n-first dynamic latches) to prevent min-delay races. Any traditional static latch circuits such as CMOS static latch circuitry (although not limited thereto) employed in processors (microprocessors) or in any highly integrated chip could use this type of latching mechanism to minimize racing violations. It can also be used in input/output (I/O) circuitry as well as in a multitude of other applications in IC chips, per se, including processor chips, where static latching is effected, thereby also preventing race violations therein.

FIG. 17 of the drawings shows another example of the present invention in which an array of static latches are used in a micro operation involving CMOS static latches 171, static CMOS logic block 172, n-first dynamic latches 173, and phase 1 domino logic circuits 174, which are used in place of the static latches (either alone or in combination with other CMOS to static logic gates). In this example, the static CMOS logic block 172 contains various assortments of combinatorial CMOS logic gates including, for example, CMOS inverters, NAND gates and NOR gates. Examples of CMOS inverters, CMOS NAND and CMOS NOR gates are typified in FIGS. 18A, 18B and 18C, respectively. Also, it is noted that at most, the number of inverter gate delays associated with the first phase operation, which is inclusive of the phase 1 CMOS static latches 171 and the static CMOS logic block 172 is limited to six when considering one such inverter gate delay is associated with each of the phase 1 static latches 171. Examples of static latches are shown in FIGS. 5A and 5B in which a CMOS gate is followed by a CMOS inverter which may include a non-clocked P-channel regeneratively connected MOSFET (keeper) $T_K$. It should also be noted, like the modifications associated with FIG. 1 of the drawings, which are depicted in FIGS. 3 and 4 and described herein, similar as well as other modifications are applicable with respect to the examples given in the embodiments shown in FIGS. 13, 14, 15, 16 and 17.

For example, instead of logic circuits including combinatorial CMOS logic circuits, although not limited thereto, the application of the dynamic logic methodology employed herein could be in connection with the transmission of data through a number of inverters or repeaters in a column. It should be noted, any time there is a limitation on the number of inversions that can be employed within a clock cycle or a phase of a cycle, you have the potential for creating a race condition there. In that case, the dynamic latch methodology employed in connection with the present invention could be applied to assure race-free conditions. Also, in place of static latch 15 in FIG. 1, static latch 15' in FIG. 3 and static latch 15" in FIG. 4 and, likewise, with regard to the other embodiments, dynamic logic could be substituted therefor such as domino logic and the like, although not limited thereto.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A signal transfer clocking circuit comprising:

a first stage including a static latch and a first non-clocking circuit in series therewith, said static latch having a data input and being opened in response to a first level of a pulse clock signal applied thereto to effect transfer of incoming data through said first stage in a first phase of operation of said signal transfer clocking circuit; and a second stage including a dynamic latch and at least a second circuit in series therewith, said dynamic latch consisting of a non-gate delay switching circuit and having a data input, coupled to an output of the first circuit, and being opened in response to a second level of a same or different pulse clock signal applied thereto as that applied to said static latch to enable a substantially race-free transfer of data generated by said first stage, through said second stage, to at least one succeeding circuit, in a second, successive phase of operation of said signal transfer clocking circuit, said succeeding circuit being opened and closed by a clock signal having phase and frequency characteristics linked to the pulse clock signal applied to said dynamic latch, wherein said signal transfer clocking circuit is provided in a processor, wherein said processor is provided with plural ones of said signal transfer clocking circuit, each said pulse clock signal having a phase and frequency based on a domain phase clock signal, generated by a clock distribution network of said processor, associated with that signal transfer clocking circuit, and wherein, in each said signal transfer clocking circuit of said processor, said pulse clock signal associated with said dynamic latch is provided either by a same local clock generator as that of said static latch or by a different local clock generator than that of said static latch, different local clock generators being associated with the same or respectively different domain phase clock signals.

2. A signal transfer clocking circuit according to claim 1, wherein said first level is the high-level and said second level is the low-level of the pulse clock signal, in the positive direction.

3. A signal transfer clocking circuit according to claim 1, wherein said processor is a microprocessor.

4. A signal transfer clocking circuit according to claim 1, wherein said static latch includes a clocked first CMOS transmission gate, consisting of an N-channel MOSFET and a P-channel MOSFET, the channels of which are connected in parallel, and a CMOS logic inverter with a keeper circuit connected thereto, said first CMOS transmission gate having a first end coupled as the data input of said first stage, and said CMOS logic inverter having an input coupled to a second end of said first CMOS transmission gate and an output coupled to an input of said first circuit, the output of which is coupled to the data input of said dynamic latch, and wherein said dynamic latch consists of a clocked second CMOS transmission gate, consisting of an N-channel MOSFET and a P-channel MOSFET, the channels of which are connected in parallel, a first end of which is coupled as the data input of said dynamic latch and a second end of which is coupled to an input of said second circuit.

5. A signal transfer clocking circuit according to claim 4, wherein the pulse clock signal is applied to the gate of one of the N- and P-channel MOSFETs of said first CMOS transmission gate and to the gate of one of the N- and P-channel MOSFETs of said second CMOS transmission gate, the gate of the other one of the N- and P-channel MOSFETs of said first CMOS transmission gate and the gate of the other one of the N- and P-channel MOSFETs of said second CMOS transmission gate being fed the signal complement of said pulse clock signal, respectively.

6. A signal transistor clocking circuit according to claim 5, wherein, in said signal transfer clocking circuit, the pulse clock signal is applied to the gate of one of the N- and P-channel MOSFETs of said first CMOS transmission gate and via an inverting circuit to the gate of one of the N- and P-channel MOSFETs of said second CMOS transmission gate, the gate of the other one of the N- and P-channel MOSFETs of both said first CMOS transmission gate and said second CMOS transmission gate are fed the signal complements thereof, respectively.

7. A signal transfer clocking circuit according to claim 1, wherein each of said first and second circuits includes at least one inverting CMOS logic circuit.

8. A signal transfer clocking circuit according to claim 1, wherein said first circuit includes at least one CMOS inverter or a combinatorial CMOS logic circuit, and said second logic circuit includes either a static or dynamic CMOS logic circuit.

9. A signal transfer clocking circuit according to claim 4, wherein each of said first and second circuits includes at least one inverting CMOS logic circuit.

10. A signal transfer clocking circuit according to claim 4, wherein said first circuit includes at least one CMOS inverter or a combinatorial CMOS logic circuit, and said second logic circuit includes either a static or dynamic CMOS logic circuit.

11. A signal transfer clocking circuit according to claim 7, wherein said inverting CMOS logic circuit includes a combinatorial CMOS logic circuit.

12. A signal transfer clocking circuit according to claim 9, wherein said inverting CMOS logic circuit includes a combinatorial CMOS logic circuit.

13. A signal transfer clocking circuit comprising:

a first stage including a static latch and a first non-clocking circuit in series therewith, said static latch having a data input and being opened in response to a first level of a pulse clock signal applied thereto to effect transfer of incoming data through said first stage in a first phase of operation of said signal transfer clocking circuit; and a second stage including a dynamic latch and at least a second circuit in series therewith, said dynamic latch consisting of a non-gate delay switching circuit and having a data input, coupled to an output of the first circuit, and being opened in response to a second level of a same or different pulse clock signal applied thereto as that applied to said static latch to enable a substantially race-free transfer of data generated by said first stage, through said second stage, to at least one succeeding circuit, in a second, successive phase of operation of said signal transfer clocking circuit, said succeeding circuit being opened and closed by a clock signal having phase and frequency characteristics linked to the pulse clock signal applied to said dynamic latch, wherein said static latch includes a clocked first CMOS transmission gate, consisting of an N-channel MOSFET and a P-channel MOSFET, the channels of which are connected in parallel, and a CMOS logic inverter with a keeper circuit connected thereto, said first CMOS transmission gate having a first end coupled as the data input of said first stage, and said CMOS logic inverter having an input coupled to a second end of said first CMOS transmission gate and an output coupled to an input of said first circuit, the output of which is coupled to the data input of said dynamic latch, wherein said dynamic latch consists of a clocked second CMOS transmission gate, consisting of an N-channel MOSFET and a P-channel MOSFET, the channels of which are connected in parallel, a first end of which is coupled as the data input of said dynamic latch and a second end of which is coupled to an input of said second circuit, wherein said signal transfer clocking circuit is provided in a processor, and wherein said processor is provided with plural ones of said signal transfer clocking circuit, each pulse clock signal of a signal transfer clocking circuit having a phase and frequency based on a domain phase clock signal, generated by a global clock distribution network of said processor, associated with that signal transfer clocking circuit.

14. A signal transfer clocking circuit according to claim 13, wherein said processor is a single-chip processor.

15. A signal transfer clocking circuit comprising:

a first stage including a static latch and a first non-clocking circuit in series therewith, said static latch having a data input and being opened in response to a first level of a pulse clock signal applied thereto to effect transfer of incoming data through said first stage in a first phase of operation of said signal transfer clocking circuit; and a second stage including a dynamic latch and at least a second circuit in series therewith, said dynamic latch having a data input, coupled to an output of the first circuit, and being opened in response to a second level of a same or different pulse clock signal applied thereto as that applied to said static latch to enable a substantially race-free transfer of data generated by said first stage, through said second stage, to at least one succeeding circuit, in a second, successive phase of operation of said signal transfer clocking circuit, said succeeding circuit being opened and closed by a clock signal having phase and frequency characteristics linked to the pulse clock signal applied to said dynamic latch, wherein said static latch is set in an open mode in response to a first level of said pulse clock signal, said pulse clock signal being a single-phase pulse clock, wherein said dynamic latch is set in an open mode in response to a pulse-stretched second level derived from a delayed logic ORing of a plurality of different clock pulse signals from that of said pulse clock signal, and wherein said at least one succeeding circuit includes a plurality of circuits, each of which is gated in an open mode by one of said plurality of different clock pulse signals.

16. A processor provided with a plurality of signal transfer clocking circuits and a clock distribution network, said signal transfer clocking circuit comprising:

a first stage including a static latch and a first non-clocking circuit in series therewith, said static latch having a data input and being set in an open mode in response to a first level of a pulse clock signal applied thereto to effect transfer of incoming data through said first stage in a first phase of operation of said signal transfer clocking circuit; and a second stage including a dynamic latch and at least a second circuit in series therewith, said dynamic latch consisting of a non-gate delay switching circuit and having a data input, coupled to an output of the first circuit, and being set in an open mode in response to a second level of a same or different pulse clock signal applied thereto as that applied to said static latch to enable a substantially race-free transfer of data generated by said first stage, through said second stage, to at least one succeeding circuit, in a second, successive phase of operation of said signal transfer clocking circuit, said succeeding circuit being opened and closed by a clock signal having phase and frequency characteristics linked to the pulse clock signal applied to said dynamic latch, wherein for each said signal transfer clocking circuit said pulse clock signal applied thereto has a phase and frequency based on a domain phase clock signal associated with that signal transfer clocking circuit, and wherein, in each said signal transfer clocking circuit of said processor, said pulse clock signal associated with said dynamic latch is provided either by a same local clock generator as that of said static latch or by a different local clock generator than that of said static latch, different local clock generators being associated with the same or respectively different domain phase clock signals, said domain clock signals being distributively generated over said processor by said clock distribution network.

17. A processor according to claim 16, wherein, in said signal transfer clocking circuit, said static latch includes a first clocked CMOS transmission gate, consisting of an N-channel MOSFET and a P-channel MOSFET, the channels of which are connected in parallel, and a CMOS logic inverter with a keeper circuit connected thereto in series therewith, and said dynamic latch consists of a second clocked CMOS transmission gate, consisting of an N-channel MOSFET and a P-channel MOSFET, the channels of which are connected in parallel.

18. A processor according to claim 17, wherein, in said signal transfer clocking circuit, the pulse clock signal is applied to the gate of one of the N- and P-channel MOSFETs of said first CMOS transmission gate and to the gate of one of the N- and P-channel MOSFETs of said second CMOS transmission gate, the gate of the other one of the N- and P-channel MOSFETs of said first CMOS transmission gate and the gate of the other of the N- and P-channel MOSFETs of said second CMOS transmission gate being fed the signal complement of said pulse clock signal, respectively.

19. A processor according to claim 17, wherein, in said signal transfer clocking circuit, the pulse clock signal is applied to the gate of one of the N- and P-channel MOSFETs of said first CMOS transmission gate and via an inverting circuit to the gate of one of the N- and P-channel MOSFETs of said second CMOS transmission gate, the gate of the other one of the N- and P-channel MOSFETs of both said first CMOS transmission gate and said second CMOS transmission gate are fed the signal complements thereof, respectively.

20. A processor according to claim 16, wherein each of said first and second circuits, of said signal transfer clocking circuit, includes at least one CMOS logic inverting circuit.

21. A processor according to claim 16, wherein said processor is a single-chip processor.

22. A signal transfer clocking circuit according to claim 20, wherein said inverting CMOS logic circuit includes a combinatorial CMOS logic circuit.

23. A processor having at least one signal transfer clocking circuit and a clock distribution network, said signal transfer clocking circuit comprising:

a first stage including a static latch and a first non-clocking circuit in series therewith, said static latch having a data input and being set in an open mode in response to a first level of a pulse clock signal applied thereto to effect transfer of incoming data through said first stage in a first phase of operation of said signal transfer clocking circuit; and a second stage including a dynamic latch and at least a second circuit in series therewith, said dynamic latch having a data input, coupled to an output of the first circuit, and being set in an open mode in response to a second level of a same or different pulse clock signal applied thereto as that applied to said static latch to enable a substantially race-free transfer of data generated by said first stage, through said second stage, to at least one succeeding circuit, in a second, successive phase of operation of said signal transfer clocking circuit, said succeeding circuit being opened and closed by a clock signal having phase and frequency characteristics linked to the pulse clock signal applied to said dynamic latch, wherein said static latch is set in an open mode in response to a first level of said pulse clock signal, said pulse clock signal being a single-phase pulse clock, wherein said dynamic latch is set in an open mode in response to a pulse-stretched second level derived from a delayed logic ORing of a plurality of different clock pulse signals from that of said pulse clock signal, and wherein said at least one succeeding circuit includes a plurality of circuits, each of which is gated in an open mode by one of said plurality of different clock signals.

24. A processor having a plurality of logic signal transfer clocking circuits and a clock distribution network operatively coupled thereto, at least one of said logic signal transfer clocking circuits comprises:

a first stage including a static latch and a first non-clocking inverting logic circuit in series therewith, said static latch having a data input and being opened in response to a first level of a pulse clock signal applied thereto to effect transfer of incoming data through said first stage in a first phase of operation of the signal transfer clocking circuit; and a second stage including a dynamic latch and at least a second circuit in series therewith, said dynamic latch consisting of a non-gate delay switching circuit and having a data input, coupled to an output of the first circuit, and being opened in response to a second level of a same or different pulse clock signal applied thereto as that applied to said static latch to enable a substantially race-free transfer of data generated by said first stage, through said second stage, to at least one succeeding circuit, in a second, successive phase of operation of said signal transfer clocking circuit, said succeeding circuit including another latch which is opened and closed by a clock signal having phase and frequency characteristics linked to the pulse clock signal applied to said dynamic latch, wherein each said pulse clock signal of a respective signal transfer clocking circuit and of a corresponding said another latch of said succeeding circuit coupled thereto has a phase and frequency determined by a domain phase clock signal associated therewith, generated by said clock distribution network.

25. A processor according to claim 24, wherein, in each said signal transfer clocking circuit of said processor, said pulse clock signal associated with said dynamic latch is provided either by a same local clock generator as that of said static latch or by a different local clock generator than that of said static latch, different local clock generators being associated with the same or respectively different domain phase clock signals.

26. A processor according to claim 25, wherein a pulse clock signal for gating said another latch is provided either by a same or different local clock generator as that of said dynamic latch of a preceding said signal transfer clocking circuit.

27. A processor according to claim 24, wherein said processor is a single-chip processor.

28. A processor having a plurality of logic signal transfer clocking circuits and a clock distribution network operatively coupled thereto, at least one of said logic signal transfer clocking circuits comprises:

a first stage including a static latch and a first non-clocking inverting logic circuit in series therewith, said static latch having a data input and being opened in response to a first level of a pulse clock signal applied thereto to effect transfer of incoming data through said first stage in a first phase of operation of the signal transfer clocking circuit; and a second stage including a dynamic latch and at least a second circuit in series therewith, said dynamic latch having a data input, coupled to an output of the first circuit, and being opened in response to a second level of a same or different pulse clock signal applied thereto as that applied to said static latch to enable a substantially race-free transfer of data generated by said first stage, through said second stage, to at least one succeeding circuit, in a second, successive phase of operation of said signal transfer clocking circuit, said succeeding circuit including another latch which is opened and closed by a clock signal having phase and frequency characteristics linked to the pulse clock signal applied to said dynamic latch, wherein said static latch is set in an open mode in response to a first level of said pulse clock signal, said pulse clock signal being a single-phase pulse clock, wherein said dynamic latch is set in an open mode in response to a pulse-stretched second level derived from a delayed logic ORing of a plurality of different clock pulse signals from that of said pulse clock signal, and wherein said at least one succeeding circuit includes a plurality of circuits, each of which is gated in an open mode by one of said plurality of different clock pulse signals.

29. A signal transfer clocking circuit comprising:

a first stage including a first latch and a first, non-clocking circuit in series therewith, said first latch having a data input and being opened in response to a first level of a pulse clock signal applied thereto to effect transfer of incoming data through said first stage in a first phase of operation of said signal transfer clocking circuit, wherein said first latch consists of a static latch which is set in an open mode in response to a first level of said pulse clock signal, said pulse clock signal being a single-phase pulse clock; and a second stage including a second, dynamic latch and at least a second circuit in series therewith, said dynamic latch having a data input, coupled to an output of the first circuit, and being opened in response to a second level of a same or different pulse clock signal applied thereto as that applied to said first latch to effect transfer of data generated by said first stage, through said second stage, to at least one succeeding circuit, in a second, successive phase of operation of said signal transfer clocking circuit, said succeeding circuit being opened and closed by a clock signal having phase and frequency characteristics linked to the pulse clock signal applied to said dynamic latch, wherein said dynamic latch is set in an open mode in response to a pulse-stretched second level derived from a delayed logic ORing of a plurality of different clock pulse signals from that of said pulse clock signal, and wherein said at least one succeeding circuit includes a plurality of circuits, each of which is gated in an open mode by one of said plural clock pulse signals.

30. A processor having at least one signal transfer clocking circuit and a clock distribution network, said signal transfer clocking circuit comprising:

a first stage including a first latch and a first, non-clocking circuit in series therewith, said first latch having a data input and being set in an open mode in response to a first level of a pulse clock signal applied thereto to effect transfer of incoming data through said first stage in a first phase of operation of said signal transfer clocking circuit, wherein said first latch consists of a static latch which is set in an open mode in response to a first level of said pulse clock signal, said pulse clock signal being a single-phase pulse clock; and a second stage including a second, dynamic latch and at least a second circuit in series therewith, said dynamic latch having a data input, coupled to an output of the first circuit, and being set in an open mode in response to a second level of a same or different pulse clock signal applied thereto as that applied to said first latch to effect transfer of data generated by said first stage, through said second stage, to at least one succeeding circuit, in a second, successive phase of operation of said signal transfer clocking circuit, said succeeding circuit being opened and closed by a clock signal having phase and frequency characteristics linked to the pulse clock signal applied to said dynamic latch, wherein said dynamic latch is set in an open mode in response to a pulse-stretched second level derived from a delayed logic ORing of a plurality of different clock pulse signals from that of said pulse clock signal, and wherein said at least one succeeding circuit includes a plurality of circuits, each of which is gated in an open mode by one of said plural clock pulse signals.

31. A processor having a plurality of logic signal transfer clocking circuits and a clock distribution network operatively coupled thereto, at least one of said logic transfer clocking circuits comprises:

a first stage including a first latch and a first, non-clocking inverting logic circuit in series therewith, said first latch having a data input and being opened in response to a first level of a pulse clock signal applied thereto to effect transfer of incoming data through said first stage in a first phase of operation of the signal transfer clocking circuit, wherein said first latch consists of a static latch which is set in an open mode in response to a first level of said pulse clock signal, said pulse clock signal being a single-phase pulse clock; and a second stage including a second, dynamic latch and at least a second circuit in series therewith, said dynamic latch having a data input, coupled to an output of the first circuit, and being opened in response to a second level of a same or different pulse clock signal applied thereto as that applied to said first latch to effect transfer of data generated by said first stage, through said second stage, to at least one succeeding circuit, in a second, successive phase of operation of said signal transfer clocking circuit, said succeeding circuit having a third latch which is opened and closed by a clock signal having phase and frequency characteristics linked to the pulse clock signal applied to said dynamic latch, wherein said dynamic latch is set in an open mode in response to a pulse-stretched second level derived from a delayed logic ORing of a plurality of different clock pulse signals from that of said pulse clock signal, and wherein said at least one succeeding circuit includes a plurality of circuits, each of which is gated in an open mode by one of said plural clock pulse signals.

\* \* \* \* \*